United States Patent
Schäfer

(10) Patent No.: US 7,519,766 B2
(45) Date of Patent: Apr. 14, 2009

(54) METHOD AND DEVICE FOR TRANSMISSION OF ADJUSTMENT INFORMATION FOR DATA INTERFACE DRIVERS FOR A RAM MODULE

(75) Inventor: Andre Schäfer, München (DE)

(73) Assignee: Infineon Technologies AG, Munich (DE)

( * ) Notice: Subject to any disclaimer, the term of this patent is extended or adjusted under 35 U.S.C. 154(b) by 399 days.

(21) Appl. No.: 11/384,811

(22) Filed: Mar. 21, 2006

(65) Prior Publication Data

US 2007/0064509 A1 Mar. 22, 2007

(30) Foreign Application Priority Data

Mar. 22, 2005 (DE) .................... 10 2005 013 238

(51) Int. Cl.
*G06F 12/00* (2006.01)
(52) U.S. Cl. .................................... 711/104
(58) Field of Classification Search ............. 711/104
See application file for complete search history.

(56) References Cited

U.S. PATENT DOCUMENTS

| 5,311,520 A | 5/1994 | Raghavachari |
| 6,643,787 B1 | 11/2003 | Zerbe et al. |
| 2005/0251356 A1* | 11/2005 | Jung .................... 702/107 |

FOREIGN PATENT DOCUMENTS

JP 6250938 9/1994

OTHER PUBLICATIONS

JEDEC Standard, DDR2 SDRAM Specifications; JESD79-2A (Revision of JESD79-2): JEDEC Solid State Technology Association, 2500 Wilson Boulevard, Arlington, VA 22201 3834, Jan. 2004: pp. 12-22 and 65.

JEDEC Standard. (Jan. 2004). "DDR2 SDRAM Specification," JEDEC Standard No. 79-2A (JESD79-2A, Revision of JESD79-2). JEDEC Solid State Technology Association: Arlington, VA, pp. 12-22 and 65.

English Translation of Indian Patent Office Examination Report.

* cited by examiner

*Primary Examiner*—Reginald G Bragdon
*Assistant Examiner*—Aracelis Ruiz
(74) *Attorney, Agent, or Firm*—Patterson & Sheridan, L.L.P.

(57) ABSTRACT

A method and a device are described for transmission of control information for the adjustment of operating parameters of drivers in the data interface of a RAM module by means of a controller, with control bits for adjustment purposes being sent during an adjustment mode by the controller as a burst of data bits at the data clock rate to the RAM module. According to the invention, each control bit which is sent from the controller via the data channel in the burst is represented by a sequence of $n \geq 2$ data bits, which have a binary value corresponding to the relevant control bit and follow one another at the data clock rate. The binary value of each control bit sent via the data channel is determined in the RAM module by detection of the binary value of the sent burst within the relevant sequence at a time at which the m-th data bit in the sequence appears, where m>1.

19 Claims, 3 Drawing Sheets

FIG 2

Destination information

| X1 | X2 | Meaning |
|---|---|---|
| 0 | 0 | No adjustment |
| 0 | 1 | Adjusting pull-up level |
| 1 | 0 | Adjustment pull-down level |
| 1 | 1 | Adjustment duty ratio |

Control information

| Y1 | Y2 | Meaning |
|---|---|---|
| 0 | 0 | Decrement by 1 step |
| 0 | 1 | No meaning |
| 1 | 0 | Increment by 1 step |
| 1 | 1 | No meaning | ns # METHOD AND DEVICE FOR TRANSMISSION OF ADJUSTMENT INFORMATION FOR DATA INTERFACE DRIVERS FOR A RAM MODULE

CLAIM FOR PRIORITY

This application claims the benefit of priority to German Application No. 10 2005 013 238.3, filed Mar. 22, 2005, the contents of which are hereby incorporated by reference.

TECHNICAL FIELD OF THE INVENTION

The invention relates to a method for transmission of control information for the adjustment of operating parameters of drivers in the data interface of a RAM module by means of a controller. The invention also relates to a device for carrying out this method.

BACKGROUND OF THE INVENTION

Random Access Memory (RAM) is a memory which can be written to and read from with the capability for direct random access to addressed memory cells. One preferred, but not exclusive, field of application of the invention is dynamic RAMs (DRAMS), in particular "synchronous" dynamic RAMs (SDRAMS), as are used as main memories or graphics memories in computers.

A RAM module is normally integrated on a semiconductor chip and contains a large number of memory cells, which are arranged in the form of a matrix in rows and columns and are generally distributed over a plurality of individually addressable banks. The chip has a plurality of external connections (also referred to in the following text as "pins"), including address pins for application of the information for the addressing of the respective memory cells to be addressed, data pins, including a strobe pin, for inputting and outputting the memory data to be written to and read from the addressed memory cells with an accompanying strobe signal, and instruction pins for application of instructions for controlling the operation of the memory. During operation, the RAM module is connected via the pins that have been mentioned and associated connecting lines to corresponding pins of a control module ("controller"), which sends the memory data to be written and receives the data that has been read, and also sends the address information as well as the control instructions.

The pins (data pins and strobe pin) which are used for data transmission are a component of a bidirectional "data interface" both at the controller and at the RAM module, which data interface also contains output drivers (Off-Chip Driver OCD) for amplification of the signals to be transmitted and reception drivers (Off-Chip Receiver OCR) for amplification of the received signals.

In order to make the RAM module flexible in terms of its options for use, that is to say to make it possible to match it to different types of use and different environments, means are normally provided in order to set various state variables, which are in this case referred to as "operating parameters" or "parameters", for short, as desired. These "mode" settings are normally made during an operating interval that is reserved for this purpose, for example in the initialization phase whenever the module is started up, by the controller, which for this purpose sends the required mode information to the module, where it is stored in a mode register. The content of the mode register then governs the values of the said parameters for subsequent operation during use of the module.

In order to store information in the mode register, the controller sends an instruction MRS ("Set Mode Register") in the form of a specific pattern of parallel bits to the instruction connections of the RAM module, and at the same time sends the mode information, likewise as a pattern of parallel bits, to other existing connections of the module. Since no memory data is transmitted between the RAM module and the controller and no memory cells are addressed either during the mode setting interval, the address connections as well as the data connections can be used for inputting the mode information during this time. A specific set of address connections is normally selected in order to carry out the role of mode information connections during the mode setting interval. Each of these dedicated connections is connected to the data input of one, and only one, cell, which is associated with it, in the mode register, whose set input is triggered by the adjustment instruction MRS.

The size of the mode register (the number of cells) is thus limited to the number of setting information connections. This restricts the adjustment capabilities, to be precise both in terms of the numbers of parameters which can be adjusted and in terms of the variation width or the fineness of the adjustment of the parameter values. For this reason, additional mode settings, which go beyond the capacity of the mode register, must be provided in a different way. It is thus advantageous, for example, for drivers in the data interface of the RAM module each to have the capability to set one or more operating parameters relatively finely. This applies in particular to the output drivers.

One important parameter, for example, of the output drivers in the data interface of the RAM module is the current level which a driver such as this must apply for a defined output load in order to reverse the charge on the relevant connecting line from the previous logic potential to the other logic potential, within one period of the data clock rate when the binary value of the signal to be transmitted changes. In systems with a high data rate (that is to say with a high data clock frequency), this current level must be matched to the system environment (line impedance, termination impedance) as a function of the data rate. Since the said current level also depends on the operating voltage and is also subject to various environmental influences, such as the temperature, it is necessary to adjust the output drivers from time to time. Similar adjustments may also be required for the reception drivers in the data interface of the RAM module.

All of the drivers that have been mentioned normally each have a pull-up branch, which is switched on in response to the one binary value of the signal to be amplified, in order to connect the output node of the driver to the "high" logic potential H, and a pull-down branch, which is switched on in response to the other binary value of the data signal, in order to connect the output node of the driver to the "low" logic potential L. The current level of a driver can be increased or decreased by increasing or decreasing the driver impedance. Because of unavoidable asymmetries in the characteristics of the pull-up and pull-down transistors, it is expedient to adjust the pull-up driver impedance and the pull-down driver impedance separately, by variation of the effective on-state impedance in the branches. This can be achieved by varying the number of parallel-connected switching transistors or by special resistive elements in the branches.

It is known for the control information for adjustment of parameters of the output drivers in the data interface of a RAM module (OCD parameters) to be transmitted from the controller via the data and strobe lines to the RAM module during an adjustment interval. The connecting branches which pass via these lines between the controller and the RAM module are referred to here as a "data channel". The control information is transmitted in serial form as a burst of control bits at the data clock rate. One appropriate method is specified in the so-called "DDR2-JEDEC Standard for DRAMs". This standard relates to a memory mode in which the data clock rate is twice as fast as the basic clock rate of the memory system (Double Data Rate "DDR"). The control bit burst contains 4 bits, which indicate which driver parameter (pull-up impedance or pull-down impedance) should be adjusted, and in which direction (increase by one step or reduce by one step). The adjustment is then carried out in the RAM module by means of a setting device which influences the stated parameter, by one step in the indicated direction. A test transmission of data is then sent via the output drivers of the RAM module to the controller using the parameter settings that have been applied, and the controller analyses the reception of this data. This action is repeated until the optimum settings are found for the OCD parameters.

The conditioning of the RAM module for this adjustment mode is carried out by inputting a specific bit pattern into selected cells in the mode register. Once the optimum settings of the OCD parameters have been found, these settings are locked by inputting a different specific bit pattern into the said cells in the mode register.

This known adjustment method has the disadvantage that the control bit burst sent via the data channel has a wider bandwidth the higher the data clock rate is. Since the bandwidth of the data channel is limited, there is thus a risk of the control bit burst being distorted, when the data clock rate is high, to such an extent that the binary values of the individual bits are no longer reliably identified in the RAM module.

SUMMARY OF THE INVENTION

In accordance with one emboidment of the present invention, there is a method for transmission of control information for the adjustment of operating parameters of drivers in the data interface of a RAM module is provided by means of a controller which has instruction and address connections in order to send instruction and address bits via instruction and address lines to instruction and address connections of the RAM module, and which has further connections in order, in a write mode, to send data bits at a given data clock rate via a data channel to corresponding connections of the data interface of the RAM module and, in a read mode, to receive data bits which have been sent from the data interface of the RAM module via the data channel, and with control bits for adjustment of the drivers being sent during an adjustment mode by the controller as a burst of data bits at the predetermined data clock rate via the data channel to the RAM module. Each control bit which is sent via the data channel is represented by a sequence of $n \geq 2$ data bits, which have a binary value corresponding to the relevant control bit and follow one another at the given data clock rate. Futher, the binary value of each control bit sent via the data channel is determined in the RAM module by detection of the binary value within the relevant sequence at a time at which the m-th data bit in the sequence appears, where $m > 1$.

In accordance with another embodiment of the present invention, there is a method for transmission of control information for the adjustment of operating parameters of drivers in the data interface of a RAM module is provided by means of a controller which has instruction and address connections in order to send instruction and address bits via instruction and address lines to instruction and address connections of the RAM module, and which has further connections in order, in a write mode, to send data bits at a given data clock rate via a data channel to corresponding connections of the data interface of the RAM module and, in a read mode, to receive data bits which have been sent from the data interface of the RAM module via the data channel, and with control bits for adjustment of the drivers being sent during an adjustment mode by the controller as a burst of data bits at the predetermined data clock rate via the data channel to the RAM module. The control bits sent via the data channel are only a subset of the total set of control bits for adjustment of the drivers and the other control bits for the adjustment of the drivers are sent by the controller via address lines to the RAM module and are stored in a mode register there.

In accordance with still another embodiment of the present invention, there is a device for transmission of control information for the adjustment of operating parameters of drivers in the data interface of a RAM module is provided by means of a controller , which contains the instruction and address connections in order to send instruction and address bits via instruction and address lines to instruction and address connections of the RAM module, further connections in order, in a write mode, to send data bits at a given data clock rate via a data channel to corresponding connections of the data interface of the RAM module and, in a read mode, to receive data bits which have been sent via the data channel from the data interface of the RAM module, a control burst generator, which can be activated during an adjustment mode in order to send control bits for the adjustment of drivers of the data interface of the RAM module as a burst of data bits via the data channel to the RAM module. The control burst generator represents each control bit to be sent via the data channel as a sequence of $n \geq 2$ data bits in the burst, which have a binary value corresponding to the relevant control bit and follow one another at the given data clock rate. The RAM module contains a control bit detector, which, during the adjustment mode determines the binary value of each control bit received via the data channel by detection of the binary value within the relevant sequence at a time at which the m-th data bit in the sequence appears, where $m \geq 2$.

In accordance with yet another embodiment of the present invention, there is a device for transmission of control information for the adjustment of operating parameters of drivers in the data interface of a RAM module is provided by means of a controller, which contains the instruction and address connections in order to send instruction and address bits via instruction and address lines to instruction and address connections of the RAM module, further connections in order, in a write mode, to send data bits at a given data clock rate via a data channel to corresponding connections of the data interface of the RAM module and, in a read mode, to receive data bits which have been sent via the data channel from the data interface of the RAM module, a control burst generator, which can be activated during an adjustment mode in order to send control bits for the adjustment of drivers of the data interface of the RAM module as a burst of data bits via the data channel to the RAM module. The control burst generator produces only a subset of the total set of control bits for the adjustment of the drivers. A further control signal transmitter is provided in the controller and applies the other control bits for the adjustment of the drivers to selected address connections. A mode register, which is contained in the RAM module, is provided for storage of the other control bits which are received via the address connections of the RAM module.

BRIEF DESCRIPTION OF THE DRAWINGS

The present invention is described below in more detail with reference to the exemplary embodiments and drawings, in which:

FIG. 2 shows coded tables of the transmitted control bits for adjustment of the output drivers in the memory system shown in FIG. 1.

DETAILED DESCRIPTION OF THE INVENTION

Figure 1:
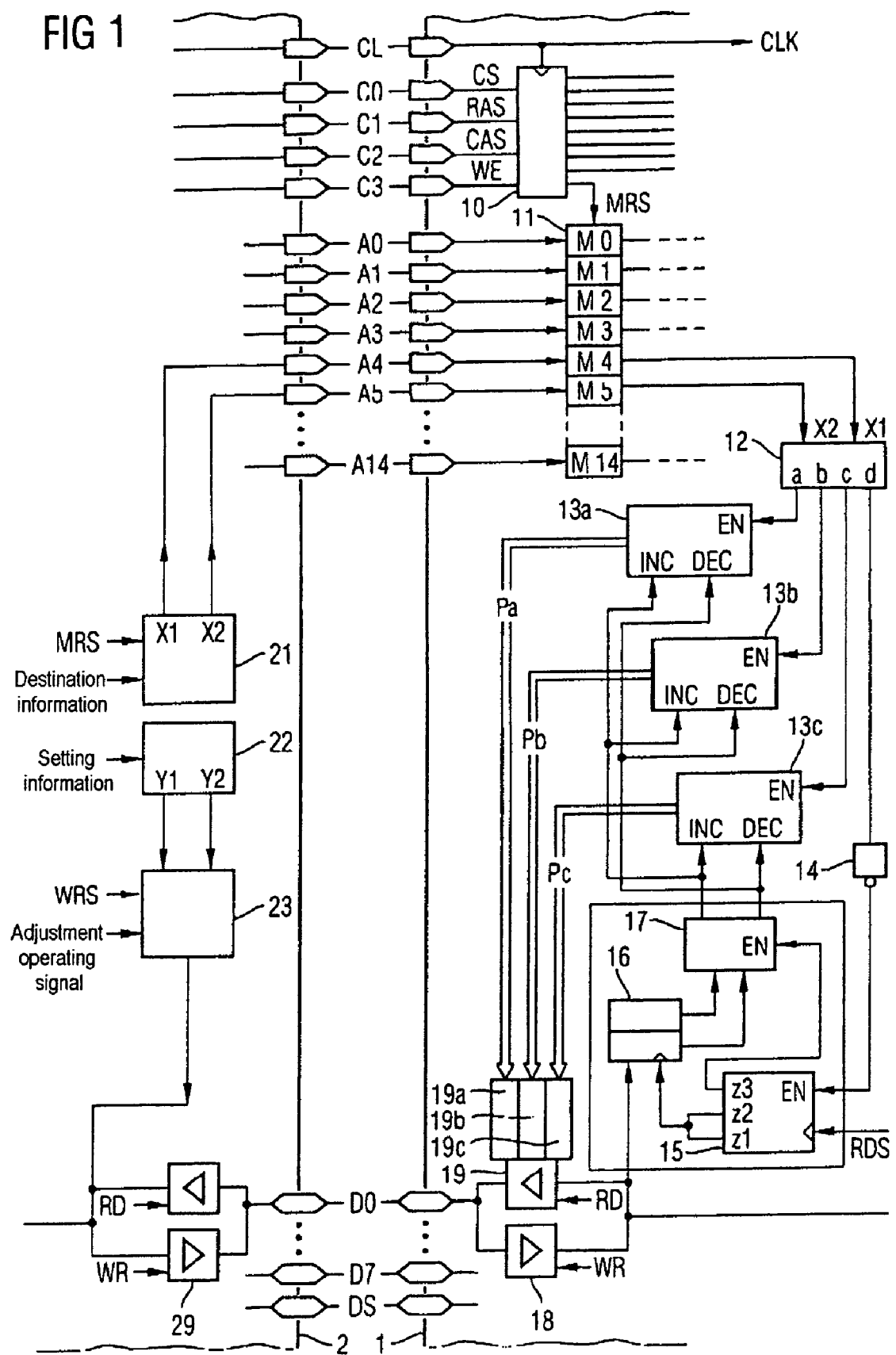
FIG. 1 shows a part of a RAM module and of an associated controller in a memory system having a device for carrying out the method according to the invention.

The invention provides a transmission of control information sent via the data channel in such a way that the risk of corruption by the restricted channel bandwidth is reduced.

The invention also provides a method and a device for transmission of control information for the adjustment of operating parameters of drivers in the data interface of a RAM module by means of a controller. The RAM module has instruction and address connections in order to send instruction and address bits via instruction and address lines to instruction and address connections of the RAM module. Further connections allow, in a write mode, to send data bits at a given data clock rate via a data channel to corresponding connections of the data interface of the RAM module and, in a read mode, to receive data bits which have been sent from the data interface of the RAM module via the data channel. Control bits for adjustment of the drivers are sent during an adjustment mode by the controller as a burst of data bits at the predetermined data clock rate via the data channel to the RAM module. According to the invention, each control bit which is sent via the data channel is represented by a sequence of n≧2 data bits, which have a binary value corresponding to the relevant control bit and follow one another at the given data clock rate. The binary value of each control bit sent via the data channel is determined in the RAM module by detection of the binary value within the relevant sequence at a time at which the m-th data bit in the sequence appears, where m>1.

The representation, according to the invention, of each of the control bits sent via the data channel to the RAM module as a sequence of two or more identical data bits effectively "lengthens" these control bits such that the bandwidth of the transmitted control information is only a fraction of the bandwidth which is required for a control bit burst of a conventional type, in which the individual control bits follow one another at the data clock of the RAM module. The reduced bandwidth of the transmitted control information according to the invention makes it possible to reliably detect the binary values of the control bits in the RAM module, even when the data clock rate is high.

The lengthening of the control bits according to the invention is, in fact, carried out without slowing down the data clock rate. Slowing down the data clock rate in the adjustment interval would admittedly likewise reduce the bandwidth of the control information, but would result in problems because it would be necessary to wait for a certain synchronization time (lock-in time) whenever the data clock frequency was changed, until the frequency and phase of the data clock had stabilized.

When a sequence of a plurality of bits with the same binary value is sent via a channel with a limited bandwidth, then the identification of the binary value at the reception end will become more reliable the further the bit sampled there is located from the first and last bit in the sequence. The further the sampled bit is away from the first bit of the sequence, the less is the risk of identification errors resulting from the set characteristic of the receiver. The further the sampled bit is away from the last bit in the sequence, the less is the risk of identification errors as a result of the hold characteristic of the receiver. The sequence should in each case preferably include at least one bit before and after that bit which is sampled for identification at the reception end. For this reason, the number n of respectively identical data bits per control bit is preferably at least equal to 3, and the order number m of the respectively sampled burst bit within the respective sequence is preferably governed by the relationship 2≧m≧n−1. However, a certain amount of progress in terms of reliability can be achieved even when n=2 and the sampling of the reception end is carried out using the second bit.

In FIG. 1, identical or similar elements are in each case annotated with the same abbreviations or numbers, with a suffix in each case being used for more detailed identification. In the following description, a colon ":" between two such numbers represents the word "to". For example, "A1:14" should thus be read as "A1 to A14".

The right-hand half of FIG. 1 shows elements of a RAM module 1 which is integrated on a chip and has a plurality of external connections, which are also referred to here as "pins" and which are connected to corresponding connections of a controller 2, during operation, by connecting lines. The illustration shows: a "clock pin" for the system or basic clock signal CLK; four "instruction pins" for four parallel instruction bits C0:3, fifteen "address pins" for fifteen parallel address bits A0:14; eight "data pins" for eight parallel data bit streams D0:7; a "strobe pin" for a data clock signal (strobe signal) DS.

The instruction bits C0:3 which are sent from the controller 2 form a 4-bit parallel code word and are decoded in the RAM module 1 by means of an instruction decoder 10, in order in each case to activate one of a plurality of instruction lines, depending on the bit pattern in the code word. The four instruction bits C0:3 are normally referred to, for historical reasons, as CS, RAS, CAS, WE. In each clock period of the clock signal CLK, the controller 2 sends some selected instruction code word, which is either an operation instruction which instructs that some operation be carried out in the RAM module, or a so-called "NOP" instruction, whose meaning is "no operation". The operation instructions include, inter alia, the write instruction WR for activation of the writing of data, the read instruction RD for activation of the reading of data, and the already mentioned instruction "set mode register", or MRS for short, for activation of a process for setting operating parameters for the RAM module.

In order to input and output the data bit streams D0:7 and the strobe signal DS, each data pin and the strobe pin as well on the RAM module 1 is connected to the input of an associated reception driver 18 and to the output of an associated output driver 19. For clarity reasons, FIG. 1 shows only the drivers for the data bit stream D0. The totality of the strobe and data pins together with the respectively associated drivers 18, 19 form the bidirectional data interface of the RAM module.

All of the drivers 18, 19 in the data interface have control connections in order to activate the reception drivers 18 in response to the write instruction WR, so that they pass the received data bit streams D0:7 and the strobe signal to associated internal data lines and an internal strobe line, respectively. In response to the read instruction RD, all the output drivers 19 are activated in order to send the data streams which have been read in the RAM module 1 via the internal data lines, as well as the accompanying strobe signal, to the controller 2.

The selection of the data memory cells to which the write data is intended to be written or from which the read data is intended to be read is made by means of the address bits, which are applied by the controller 2 at a suitable time. A specific subset of the address pins is used for bank addressing, and the other address pins are used for row and column addressing. The row and column address bits are decoded in row and column address decoders. The address decoders and their connections to the address pins are not shown in FIG. 1, nor is the matrix of the memory cells and the internal control circuit for connecting the data transmission paths between the respective data drivers 18 and 19 and the respectively addressed memory cells. All of these elements may be of a conventional type, as is generally known in the field of RAM modules.

The numbers of address pins and data pins shown in FIG. 1 are only one example. The illustrated case of eight data pins allows data words to be written and read using a parallel format with a word length of 8 bits, that is to say each address addresses a group of 8 memory cells in the memory matrix (so-called "×8 module"). RAM modules with 4 or 16 or even 32 data pins are also normally used at the moment, with the latter (that is to say ×32 modules) being used in particular as graphics memories. The required number of address bits depends on the one hand on the memory size (the total number of data memory cells), and on the other hand on the number of data pins being used. The number of address pins may accordingly also be less than or more than the number in the illustrated example.

As already mentioned, the address pins and the data pins can be used for inputting control information for adjustment of various operating parameters for the RAM module. The control information which is input via the address pins, and is also referred to as "mode information", is normally transmitted to a so-called mode register, where it is stored. For this purpose, each of the 15 address pins is connected to the data input of a respectively associated example of 15 cells M0:14 of a mode register 11, whose trigger or set connection is connected to that instruction line of the instruction decoder 10 which is activated on reception of the "set mode register" instruction (MRS instruction). The 15-cell mode register 11 thus holds the mode information, which comprises 15 bits and is applied to the address pins at the time of the MRS instruction. The 15 outputs of the fifteen mode register cells M0:14 thus provide an image of this information.

A plurality of setting devices are provided for each of the drivers, in each case one for each parameter, for adjustment of the parameters of these output drivers 19. As an example, FIG. 1 illustrates the situation in which three different parameters Pa, Pb and Pc can be set at each output driver 19, to be precise the pull-up and pull-down impedances Pa and Pb which were mentioned above and govern the driver impedance, and, furthermore, the so-called duty ratio Pc of the transmitted data or strobe pulses. This last-mentioned parameter defines the ratio between the length of the pulses of different polarity, which represent the two different binary values in a bit stream that is transmitted at the data clock rate. This ratio should preferably be equal to unity, although it may differ from this value because of asymmetries in the drivers, to be precise as a function of environmental conditions, so that an adjustment capability is desirable. An adjustment such as this can be carried out, for example, by means of variable delay circuits for individually delaying the falling flank and rising flank of the pulses transmitted from the driver 19. The setting devices for the driver parameters Pa, Pb, Pc are illustrated schematically as the blocks 19a, 19b, 19c, adjacent to the driver 19, in FIG. 1.

The values to be set for the parameters Pa, Pb, Pc are passed by associated counters 13a, 13b, 13c as multiple bit counts in parallel form to the setting devices 19a, 19b, 19c. The counters 13a:c have an increment input INC and decrement input DEC, and can be switched on individually by activation of a capability signal at their activation input EN. The respectively activated example of the counters 13a:c counts one counting step upward whenever an effective signal flank appears at the INC input, and counts one counting step downward whenever an effective signal flank appears at the DEC input. On reaching the maximum count, any further INC signal flanks have no effect, and on reaching the count zero, any further DEC signal flanks have no effect.

In the exemplary embodiment shown in FIG. 1, the controller 2 sends the control information for adjustment of the parameters Pa, Pb, Pc partially via address lines and partially via the data channel. The information which is sent via the address connections is the "destination information" which indicates which of the three parameters Pa, Pb, Pc has been chosen for adjustment. The information which is sent via the data channel is the "setting information", which indicates whether the selected parameter should be incremented or decremented. In the example described here, the control information in total comprises 4 control bits, with two control bits X1, X2 representing the destination information, and two control bits Y1, Y2 representing the setting information.

The two control bits X1, X2 for the destination information are supplied from a required bit coder 21 in the controller 2 and are transmitted via two selected address lines, in parallel form, to two associated cells in the mode register 11 in the RAM module 1, when the controller sends the MRS instruction. In the illustrated case, these are the mode register cells M4 and M5. The meanings of the various patterns of the 2-bit combination X1;X2 are listed in the upper table in FIG. 2, and are decoded in the RAM module 1 by means of a 1-from-2 decoder 12, which has four outputs a, b, c, d.

The only effect of the a output of the decoder 12 is to switch on the counter 13a for incrementing or decrementing the parameter Pa (pull-up driver impedance) when the destination information X1;X2 has the bit pattern "0;1". The only effect of the b output of the decoder 12 is to switch on the counter 13b for incrementing or decrementing the parameter Pb (pull-down driver impedance) when the destination information has the bit pattern "1;0". The only effect of the c output of the decoder 12 is to switch on the counter 13c for incrementing or decrementing the parameter Pc (duty ratio) when the destination information has the bit pattern "1;1". In the case of the bit pattern "0;0" of the destination information all of the counters 13a:c remain switched off; instead of this the d output of the decoder 12 becomes effective, which means that no adjustment should be carried out. Inversion of this information in an inverter 14 thus produces an adjustment operating signal, which defines the adjustment interval and is effective only when adjustment is intended to be carried out.

Figure 3:
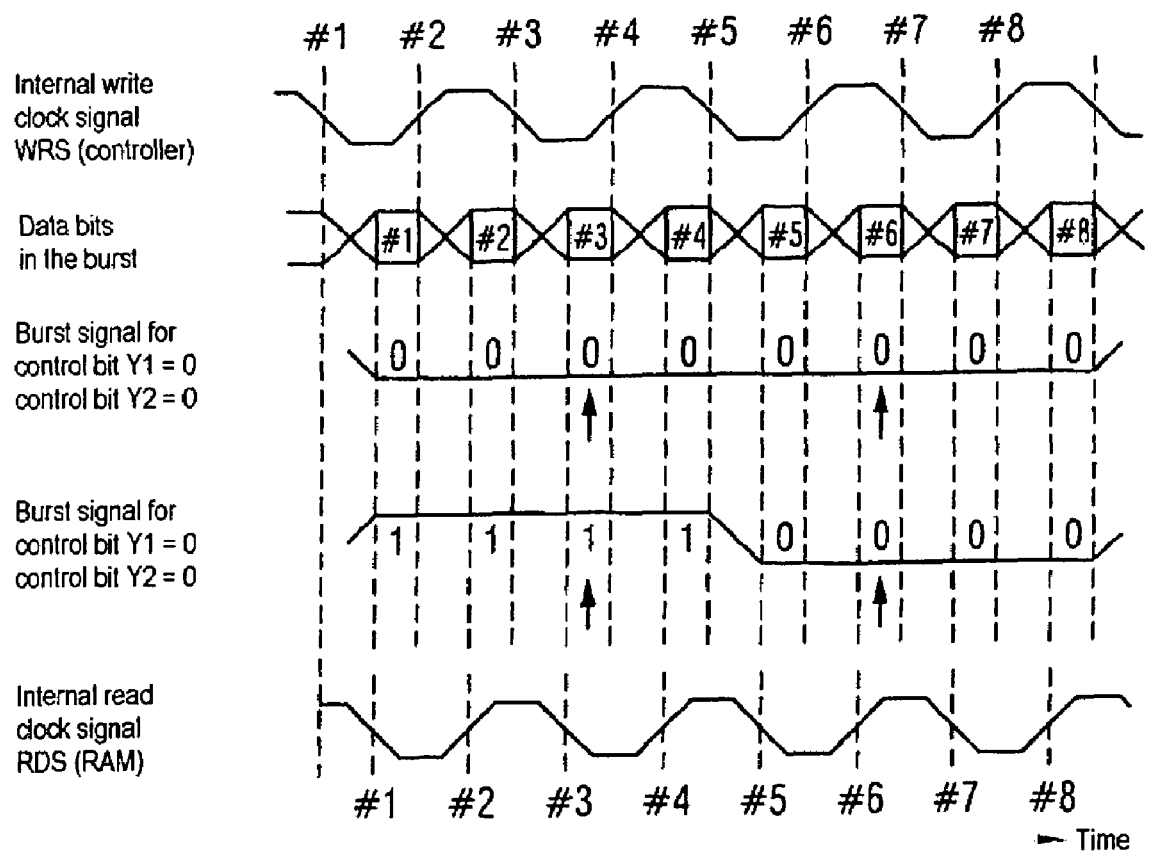
FIG. 3 illustrates the layout of the transmission according to the invention of control bits via the data channel.

The two control bits Y1 and Y2 for the setting information, that is to say for changing the direction of the respectively selected parameter, are supplied from a setting bit coder 22 in the controller 2. The meanings of the various patterns of this 2-bit combination Y1;Y2 are listed in the lower table in FIG. 2. Accordingly, the bit pattern "0;0" stipulates decrementing, and the bit pattern "1;0" stipulates incrementing. The other possible bit patterns have no meaning. According to the invention, the control bit pattern Y1;Y2 is converted by means of a burst generator 23 to a burst of serial data bits in which each control bit is represented by a sequence of n successive data bits, which all have the same binary value as the relevant control bit. This transmission scheme is illustrated in FIG. 3 using a timing diagram, to be precise for the situation chosen as an example in which n=4.

The burst generator 23 receives the internal write clock signal WRS which determines the data clock rate, is derived from the clock signal CLK in the controller and, during normal useful operation of the memory system, controls the sampling of the write data as well as the generation of the strobe signal DS to be transmitted. This write clock signal WRS is shown in the top line of the diagram in FIG. 3. In the case of "SDR" operation ("single data rate"), the data sampling is carried out only on each of the rising flanks or only on each of the falling flanks of the write clock signal WRS. In the case of "DDR" operation ("double data rate"), the data sampling takes place both on each rising flank and on each falling flank of the write clock signal WRS. The example described here is based on DDR operation. For operation such as this with successive sampling flanks #1, #2, . . . of the write clock signal WRS, the second line of the diagram in FIG. 3 shows the successive time blocks in which the associated data bits #1, #2, . . . are in each case valid when the binary values of these data bits are "0" and "1" alternately.

In order to transmit the control bits Y1 and Y2, the write instruction WR is produced at the same time as the adjustment operating signal in the controller 2. This signal is the negation of the destination information "no adjustment". Once the adjustment operating signal becomes effective, the burst generator 23 first of all samples the control bit Y1, then the control bit Y2, on each flank of the strobe signal DS, and in each case n-times successively, and sends the burst formed in this way via an associated output driver 29 of the controller 2 and via the data channel to the associated reception driver 18 in the RAM module 1. The third line in the diagram in FIG. 3 shows the amplitude profile of the setting information signal which is sent by the controller 2 in the situation where the control bit Y1="0" and the control bit Y2="0" (setting information: "decrementing"), so that the transmitted burst is a sequence of eight zeros (a first sequence of n=4 zeros and a second sequence of n=4 zeros). The fourth line in the diagram in FIG. 3 shows the amplitude profile of the setting information signal which is sent from the controller 2 in the situation where the control bit Y1="1" and the control bit Y2="0" (setting information: "incrementing"), so that the transmitted burst comprises a first sequence of n=4 ones, and a subsequent sequence of n=4 zeros.

Since each control bit in the setting information signal that is transmitted is represented by n identical data bits, each control bit appears to be lengthened over a plurality of data clock periods, so that it can be detected well in the RAM module even when the setting information signal is highly distorted because of the limited bandwidth of the transmission channel. The detection process is preferably carried out by sampling the received setting information signal as close as possible to the centre of each n-bit sequence of the data bit burst, that is to say at the n/2-th bit or at the (1+n/2)-th bit of the relevant sequence when n is an even number, and at the (n+1)2-th bit when n is an odd number. Sampling as close as possible to the centre of each n-bit sequence has the advantage that the detection of the relevant control bits is reliable not only if the set characteristic is poor but also in the case of a poor hold characteristic of the reception driver 18.

In the illustrated situation in which n=4, it is thus advantageous to carry out sampling at the data bit #2 or #3 (the second or third bit in the first sequence) for detection of the control bit Y1, and to carry out sampling at the data bit #6 or #7 (the second or third data bit in the second sequence) for detection of the control bit Y2. In the illustrated example, the first control bit Y1 is sampled at the data bit #3 and the second control bit Y2 is sampled at the data bit #6, as is indicated by the arrows in the diagram in FIG. 3. The sampling is carried out by means of corresponding flanks #3 and #6 of an internal read clock signal RDS, which is derived in the RAM module 1 from the clock signal CLK received there, with the same frequency and phase relationship as that with which the write clock signal WRS is derived in the controller 2 from the clock signal CLK there.

The two control bits Y1 and Y2 which are detected in the RAM module 1 are decoded in order either to apply a decrement pulse to the DEC inputs or to apply an increment pulse to the INC inputs of the counters 13$a$:$c$, depending on the pattern in the bit combination Y1;Y2, as shown in the lower table in FIG. 2. Any suitable logic circuit may be used for detection and decoding of the control bits Y1, Y2, and its implementation should not create any problem for a person skilled in the art. FIG. 1 shows one example of a circuit such as this.

According to the illustration in FIG. 1, a counting circuit 15 is provided for time control of the sampling of the setting information signal in the RAM module 1, which counts down the data bit periods of this signal, and in each case produces a sampling pulse on reaching the counts z1=3 and z2=6, and produces an evaluation pulse at a third count z3>6. For this purpose, the internal read clock signal RDS is applied to the counting input of the counting circuit 15. Outside the adjustment intervals, that is to say for as long as the decoder 12 is producing the information "no adjustment" at its d output, the adjustment operating signal which is produced by the inverter 14 is inactive, so that the counting circuit 15 which receives this signal at its activation input EN remains inactive, and remains reset at zero. At the start of an adjustment interval, the adjustment operating signal at the EN input of the counting circuit 15 becomes effective, and the counting circuit counts the flanks of the internal read clock signal RDS. The sample pulses which are produced for the counts "3" and "6" are used to clock a two-stage shift register 16, whose data input receives the setting information signal.

The shift register 16 is clocked for the first time with the count "3", and the binary value of the setting information signal which exists at this time and represents the first control bit Y1 is written as the first bit to the first stage of the register. At the count "6", the register is clocked for the second time, and the binary value of the setting information signal which exists at this time and represents the second control bit Y2 is written to the first stage of the register 16, with the first control bit Y1 being shifted to the second stage. The outputs of the two register stages are connected to the two inputs of a 1:2 decoder 17. When the third count z3 (for example z 3=7) is reached, the evaluation pulse which then appears activates the decoder 17. If the pattern of the control bits Y1;Y2 which are stored in the stages of the shift register 16 is equal to "0;0", then the decoder 17 produces a pulse on a first output line, which leads to the DEC inputs of the counters 13$a$:$c$. If the pattern of the control bits Y1;Y2 which are stored in the stages of the shift register 16 is equal to "1;0", then the decoder 17 produces a pulse on a second output line, which leads to the INC inputs of the counters 13$a$:$c$.

The only counters 13$a$:$c$ which are effective are those whose EN input is activated by the destination information decoder 12. It is therefore just those parameters Pa, Pb or Pc which are defined by the destination information X1;X2 in the mode register 11 which are decremented or incremented by one step, as a function of the setting information Y1;Y2.

This ends the adjustment interval, and the destination information X1;X2 can be set by the controller 2 to "0;0", as a result of which the adjustment operating signal at the output of the inverter 14 in the RAM module 1 becomes ineffective, and the counting circuit 15 is reset to zero. In a subsequent test mode, in which the RAM module 1 sends a predefined test data pattern to the controller 2, it is possible to use the data received there to check whether the new setting of the selected parameter is satisfactory. Depending on the result of this test, the adjustment may be repeated in order to increment or decrement the same parameter, or to adjust another parameter.

A dedicated detection and adjustment circuit for parameter adjustment is preferably provided for each output driver 19 of the RAM module 1, that is to say the group of elements 13$a$:$c$, 16, 17, 19$a$:$c$ is provided more than once, with in each case one for each output driver 19. In a similar manner, a corresponding plurality of setting bit coders 22 and burst generators 23 are provided in the controller 2, in each case one for each of the data channels which lead to the reception drivers 18 of the RAM module 1. That parameter which is selected by the destination information X1;X2 can thus be adjusted simultaneously for all of the output drivers 19, but individually for each output driver 19, depending on the individually associated control bits Y1;Y2.

If, on the other hand, the aim is to be satisfied that each parameter can be adjusted to the same extent for all the output drivers 19, then only a single common detection and adjustment circuit is required in the RAM module 1, and is connected in parallel to all of the output drivers 19. In a similar manner, a single setting bit coder 22 and a single burst generator 23, which is connected in parallel to all of the controller output drivers 29, is also then sufficient in the controller 2.

Once the output drivers 19 of the RAM module 1 have been adjusted, the reception drivers 18 can also be adjusted in a similar manner. For this purpose, a circuit arrangement (in each case an individual circuit arrangement or one common circuit arrangement) for detection of the control bits and for adjustment of various driver parameters can likewise be provided for all of the reception drivers 18, although this is not illustrated in FIG. 1, for clarity reasons, and can be designed in precisely the same way as has been described above for the adjustment of the output drivers 19. Other cells in the mode register can be used for the destination information, that is to say in order to indicate which of the parameters of the reception drivers 18 are intended to be adjusted.

After each adjustment step for a parameter of the reception drivers 18, a test run can be carried out, during which the controller 2 sends a test data pattern which is written via the reception drivers 18 to the memory cells in the RAM module 1, and is then read again and is sent back to the controller 2 via the (already adjusted) output drivers 19. The controller 2 then compares each of the test patterns to check whether the new setting of the selected parameter is satisfactory. Depending on the result of this test, the adjustment of the relative parameter can be repeated, for further incrementation or decrementation of the same parameter, or for adjustment of another parameter of the reception drivers.

The details described above with reference to the drawings form only one exemplary embodiment, to which, of course, the invention is not restricted. For example, the number n of successive data bits may be different for control bits with a different binary value. The control bits which are in each case sent as a lengthened sequence via the data channel in the manner according to the invention can also include other control information than just the adjustment direction ("decrementing" or "incrementing"), for example a representation of the parameter value to be set and/or the destination information for selection of the parameter to be adjusted.

While the foregoing is directed to embodiments of the present invention, other and further embodiments of the invention may be devised without departing from the basic scope thereof, and the scope thereof is determined by the claims that follow.

What is claimed is:

1. A method for transmission of control information for the adjustment of operating parameters of drivers in the data interface of a memory module by means of a controller which has instruction and address connections, comprising:

sending data bits, in a write mode, at a given data clock rate via a data channel to corresponding connections of the data interface of the memory module;

receiving data bits, in a read mode, which have been sent from the data interface of the memory module via the data channel; and sending control bits for adjustment of the drivers during an adjustment mode by the controller as a burst of data bits at a predetermined data clock rate via the data channel to the memory module, wherein each control bit which is sent via the data channel is represented by a sequence of $n \geq 2$ data bits, which have a binary value corresponding to the respective control bit and follow one another at the given data clock rate, and wherein the binary value of each control bit sent via the data channel is determined in the memory module by detection of the binary value within the respective sequence at a time at which the m-th data bit in the sequence appears, where m>1.

2. The method according to claim 1, wherein $n \geq 3$ and $2 \geq m \geq n-1$.

3. The method according to claim 2, wherein m is equal to n/2 or is equal to 1+n/2, when n is an even number, and wherein m is equal to (n+1)/2 when n is an odd number.

4. The method according to claim 1, wherein the control bits sent via the data channel are only a subset of a total set of control bits for adjustment of the drivers, and wherein the other control bits for the adjustment of the drivers are sent by the controller via address lines to the memory module, and are stored in a mode register located in the memory module.

5. A method for transmission of control information for the adjustment of operating parameters of drivers in the data interface of a memory module by means of a controller which has instruction and address connections, comprising:

sending data bits, in a write mode, at a given data clock rate via a data channel to corresponding connections of the data interface of the memory module;

receiving data bits, in a read mode, which have been sent from the data interface of the memory module via the data channel; and sending control bits for adjustment of the drivers during an adjustment mode by the controller as a burst of data bits at a predetermined data clock rate via the data channel to the memory module, wherein the control bits sent via the data channel are only a subset of a total set of control bits for adjustment of the drivers, and wherein the other control bits for the adjustment of the drivers are sent by the controller via address lines to the memory module, and are stored in a mode register located in the memory module, wherein each control bit which is sent via the data channel is represented by a sequence of $n \geq 2$ data bits, which have a binary value corresponding to the control bit and follow one another at the given data clock rate, and wherein the binary value of each control bit sent via the data channel is determined in the memory module by detection of the binary value within the sequence at a time at which the m-th data bit in the sequence appears, where m>1.

6. The method according to claim 5, wherein the control bits sent via the address lines contain destination information for determination of the parameter to be adjusted, and wherein the control bits sent via the data channel contain setting information for setting the value of the parameter to be adjusted.

7. The method according to claim 6, wherein the control bits sent via the data channel contain only the information which indicates whether the parameter to be adjusted should be incremented or decremented.

8. A device for transmission of control information for the adjustment of operating parameters of drivers in the data interface of a memory module by means of a controller, comprising:
instruction and address connections configured to send instruction and address bits via instruction and address lines to instruction and address connections of the memory module;
further connections configured to, in a write mode, to send data bits at a given data clock rate via a data channel to corresponding connections of the data interface of the memory module and, in a read mode, to receive data bits which have been sent via the data channel from the data interface of the memory module;
a control burst generator, which is activated during an adjustment mode in order to send control bits for the adjustment of drivers of the data interface parameters of the memory module as a burst of data bits via the data channel to the memory module, wherein the control burst generator represents each control bit to be sent via the data channel as a sequence of n≧2 data bits in the burst, which have a binary value corresponding to the control bit and follow one another at the given data clock rate, and wherein the memory module contains a control bit detector, which, during the adjustment mode determines the binary value of each control bit received via the data channel by detection of the binary value within the sequence at a time at which the m-th data bit in the sequence appears, where m≧2.

9. The device according to claim 8, wherein n≧3 and 2≧m≧n−1.

10. The device according to claim 9, wherein m is equal to n/2 or is equal to 1+n/2, when n is an even number, and wherein m is equal to (n+1)/2 when n is an odd number.

11. The device according to claim 8, wherein the control burst generator produces only a subset of a total set of control bits for the adjustment of the drivers, wherein a further control signal transmitter is provided in the controller and applies the other control bits for the adjustment of the drivers to selected address connections, and wherein a mode register, which is contained in the memory module, is provided for storage of the other control bits which are received via the address connections of the memory module.

12. A system, comprising the device of claim 8 and a plurality of electrical components, the plurality of electrical components being at least one of structurally and functionally related.

13. The system of claim 12, wherein an electrical component is the memory module.

14. A device for transmission of control information for the adjustment of operating parameters of drivers in the data interface of a memory module by means of a controller, comprising:
instruction and address connections configured to send respective instruction and address bits via respective instruction and address lines to respective instruction and address connections of the memory module;
further connections configured, in a write mode, to send data bits at a given data clock rate via a data channel to corresponding connections of the data interface of the memory module and, in a read mode, to receive data bits which have been sent via the data channel from the data interface of the memory module;
a control burst generator, which is activated during an adjustment mode in order to send control bits for the adjustment of drivers of the data interface of the memory module as a burst of data bits via the data channel to the memory module, wherein the control burst generator produces only a subset of a total set of control bits for the adjustment of the operating parameters, wherein a further control signal transmitter is provided in the controller and applies the other control bits for the adjustment of the operating parameters to selected address connections, and wherein the control burst generator represents each control bit to be sent via the data channel as a sequence of n≧2 data bits in the burst, which have a binary value corresponding to the control bit and follow one another at the given data clock rate, and wherein the memory module contains a control bit detector, which, during the adjustment mode determines the binary value of each control bit received via the data channel by detection of the binary value within the sequence at a time at which the m-th data bit in the sequence appears, where m≧2.

15. The device according to claim 14, wherein the control bits which are applied to selected address connections by the further control signal transmitter of the controller contain destination information for selection of the parameter to be adjusted, and wherein the control bits which are transmitted from the control burst generator via the data channel contain setting information for setting the value of the parameter to be adjusted.

16. A device according to claim 15, wherein the control bits which are transmitted via the data channel from this control burst generator contain only the information which indicates whether the parameter to be adjusted should be incremented or decremented.

17. The device according to claim 14, wherein a mode register, which is contained in the memory module, is provided for storage of the other control bits which are received via the address connections of the memory module.

18. A system, comprising the device of claim 14 and a plurality of electrical components, the plurality of electrical components being at least one of structurally and functionally related.

19. The system of claim 18, wherein an electrical component is the memory module.

* * * * *